United States Patent
Hed

[11] Patent Number: 5,087,610
[45] Date of Patent: Feb. 11, 1992

[54] SWITCHABLE SUPERCONDUCTING ELEMENTS AND PIXELS ARRAYS

[75] Inventor: Aharon Z. Hed, Nashua, N.H.

[73] Assignee: International Superconductor Corp., Riverdale, N.Y.

[21] Appl. No.: 314,427

[22] Filed: Feb. 22, 1989

[51] Int. Cl.$^5$ ............... H01B 12/00; G09G 3/20; H03K 17/92

[52] U.S. Cl. ............... 505/1; 340/752; 340/783; 505/727; 307/245; 307/306

[58] Field of Search ........... 340/252, 263, 283, 825.79; 307/245, 306, 201; 350/321, 610, 331 R, 342, 361; 505/1, 727, 705, 776, 825; 324/248

[56] References Cited

U.S. PATENT DOCUMENTS

| | | | |
|---|---|---|---|
| 3,581,113 | 5/1971 | Kafka | 307/245 |
| 3,744,038 | 7/1973 | Kneupel et al. | 307/245 |
| 4,500,176 | 2/1985 | MacNeal | 340/783 |
| 4,870,379 | 9/1989 | Aihara et al. | 505/1 |
| 4,886,776 | 12/1989 | Early et al. | 350/1.1 |
| 4,904,882 | 2/1990 | Szu | 307/306 |

FOREIGN PATENT DOCUMENTS 0142330 6/1988 Japan.
0167788 7/1989 Japan.

Primary Examiner—Jeffery Brier
Assistant Examiner—Chanh Nguyen
Attorney, Agent, or Firm—Herbert Dubno

[57] ABSTRACT

An array of superconducting elements in which each element can be quenched into the nonsuperconductive or normal state independently at will. The array can be used to form spatially and temporally variable images or for forming spatially and temporally variable magnetic fields. The array is controlled in the form of a network of electrically interconnected superconducting elements in which a given element is quenched if and only if two independent parameters are applied to the element simultaneously.

22 Claims, 9 Drawing Sheets

SWITCHABLE SUPERCONDUCTING ELEMENTS AND PIXELS ARRAYS

CROSS REFERENCE TO RELATED APPLICATIONS

This application is related to the following copending applications:

Ser. No. 07/281,832 filed on 8 Dec. 1988, entitled "DIAMAGNETIC COLLOIDS CONTAINING SUPERCONDUCTING PARTICLES";

Ser. No. 07/290,178 filed on 23 Dec. 1988, entitled "HIGH TEMPERATURES JOSEPHSON JUNCTIONS WITH NON OXIDE INSULATING BARRIERS";

Ser. No. 07/288,403 filed on 21 Dec. 1988, now U.S. Pat. No. 4,975,265 issued 4 Dec. 1990, entitled "DELTA SINGLET OXYGEN CONTINUOUS REACTOR";

Ser. No. 07/291,681 filed on 29 Dec. 1988, entitled "PROCESS FOR CONTINUOUS MANUFACTURE OF HIGH TEMPERATURE SUPERCONDUCTING WIRES FROM MOLTEN SUPERCONDUCTING OXIDES";

Ser. No. 07/291,685 filed on 29 Dec. 1988, entitled "SWITCHABLE SUPERCONDUCTING MIRRORS";

Ser. No. 07/292,471 filed on 30 Dec. 1988, entitled "PROCESS FOR CONTINUOUS MANUFACTURE OF HIGH TEMPERATURE SUPERCONDUCTING WIRES BY ELECTRON BEAM REMELTING" (now abandoned);

Ser. No. 07/292,469 filed on 30 Dec. 1988, entitled "SUPERCONDUCTING MIRRORS";

Ser. No. 07/292,471 filed on 30 Dec. 1988, entitled "WIRES BY PLASMA DEPOSITION ON A CORE WIRE" (now abandoned);

Ser. No. 07/300,281 filed on 19 Jan. 1989, entitled "CONTROL OF PARTICLE SIZE AND SIZE DISTRIBUTION OF SUPERCONDUCTING AND OTHER SPHERICAL PARTICLES PRODUCED BY CENTRIFUGAL MEANS" (now abandoned); and Ser. No. 07/314,426 filed on 22 Feb. 1989, entitled "ELECTRONIC MODULATION OF MAGNETIC FIELDS".

FIELD OF THE INVENTION

The present invention relates to the control of pixel arrays of superconductive elements, e.g. for display or for magnetic field control purposes.

BACKGROUND OF THE INVENTION

The art of displaying an image by dividing it into a large number of picture elements (pixels), and then acting on each element to modify its optical properties is well known. This technology has culminated in a number of methodologies including, cathode ray tubes, liquid crystal displays, electroluminescent displays, and gas discharge displays. Flat screen geometries have been achieved in all of these technologies.

Nevertheless, each of these technologies has its shortcomings for different applications.

Electroluminescent displays are limited in screen brightness while liquid crystal displays must be viewed from a restricted angle. Gas discharge displays are still expensive. With the advent of higher critical temperature superconductors, and in view of developments summarized in the co-pending applications entitled respectively: "Superconducting Mirrors", "Switchable Superconducting Mirrors" and "Electronic Modulation of Magnetic Fields", a new technology involving switchable superconducting pixel arrays may eventually find applications in display technology.

Similarly, in the prior art there is no known method in which magnetic fields can be easily controlled in an array format point by point, thus providing a spatially and temporally controlled magnetic field pattern on a surface directly from an electronic data processing system. This except in the art of magnetization of magnetic media (like in magnetic computer memory devices) where the mechanical movement of a magnetizing device must be used and where the resulting field variations are extremely weak.

I have found that superconducting pixels can be employed as an array, with each superconducting pixel switchable at will, by techniques taught in a co-pending Application entitled, "Switchable Superconducting Mirrors" thus creating images when the superconducting pixels are functional mirrors, or magnetic latent images when no external illumination is used, as taught in yet another co-pending Application entitled "Electronic Modulation of Magnetic Fields".

OBJECT OF THE INVENTION

Thus, an object of this invention is to provide improved method of forming superconducting pixels as an array.

Another object of this invention is to provide a method of forming reflective superconducting pixels as an array.

Another object is to provide a method of switching superconducting pixels at will by the simultaneous application of two switching currents or magnetic fields.

Still another object is to provide a superconducting pixel array capable of displaying continuous pictures in real time.

Yet another object is to provide an array of superconducting elements that acts as a temporal and spatial modulator of an external magnetic field.

A final object is to provide a pixel array, based on superconducting materials, which can be controlled in real time so as to display images continuously, or alternately modulate temporally and spatially magnetic fields.

SUMMARY OF THE INVENTION

The invention is a superconducting pixel array capable of displaying continuous pictures that are controlled essentially electronically or, alternatively, a similar array capable of temporally and spatially modulating a magnetic field in its vicinity. The instant invention employs superconducting elements capable of being quenched from the superconductive state to the nonsuperconductive state and thus from a reflective state to a nonreflective state. The same elements exclude or do not exclude magnetic fields depending upon whether the elements are in the superconducting state on nonsuperconducting state and thus are used to modulate magnetic fields. The quenching is being achieved by the application of selected switching methods, including application of: magnetic fields, electrical currents and/or thermal effects. These switching methods can be applied either sequentially or simultaneously, separately or in pairs. The individual pixels are first "primed" by application of a selected method, then caused to enter into the normal nonsuperconducting state by application of a second switching method.

The products of the present invention can be used in a variety of optical detection devices, in management of position of magnetic liquids (both ferromagnetic colloids and diamagnetic colloids).

In my invention, I prefer to form a pixel array using superconducting elements whose reflective properties can be controlled by the application of suitable magnetic fields, or an electrical current.

BRIEF DESCRIPTION OF THE DRAWINGS

The above and other objects, features and advantages of my invention will become more readily apparent from the following description, reference being made to the accompanying highly diagrammatic drawing in which:

FIG. 1 is a schematic illustration of a superconducting pixel array. The said, array is organized in rows and columns, as is known in the prior art. Each pixel in the superconducting pixel array (1) is electrically connected to a horizontal driver (2) and a vertical driver (3). I have named the horizontal drivers as the priming drivers and the vertical drivers as the switching drivers.

It should be understood that while I have described in detail only the more efficient modes of operation of the instant invention where the superconducting pixel arrays are organized in row and columns, those skilled in the art can conceive of arrays arranged in other appropriate ways. One such way involves the arrangement where each of the superconducting pixels is independently connected to a common source so as to effect quenching of each of the said pixel elements in an independent manner, or as part of any set of elements desired, either sequentially or simultaneously.

Figure 1:
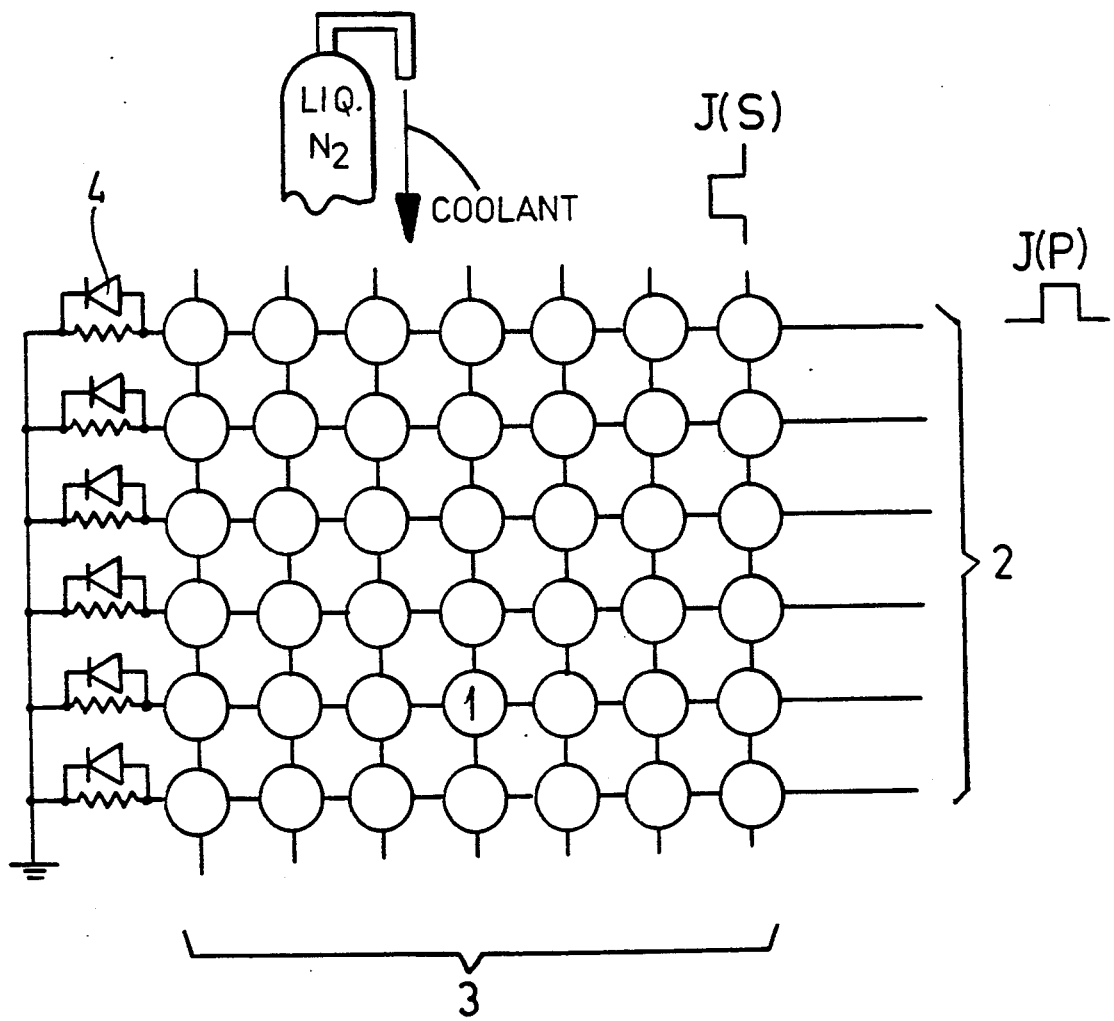
FIG. 1 is a schematic diagram of a superconductor pixel array according to my invention.

I have found that quenching of each superconducting pixel is best achieved by passing through said pixel element a critical current, or alternately applying to any of said elements a critical magnetic field. Still another method involves raising the temperature of any pixel element above the critical temperature of said superconducting pixel element. I have also established that any combination of these parameters can be applied to said pixel elements, and arrays of pixel elements as well. All these technique of switching a single superconducting element have been described in the above-mentioned co-pending Application entitled "Switchable Superconducting Mirrors". As a matter of fact, I have discovered that one is limited only by the actual difficulty of implementation, as it applies to high densities of superconducting pixel arrays. Returning back to FIG. 1 and the array of superconducting pixels presented therein, I prefer that the leads carrying the priming and switching currents be made of a superconducting material having a higher critical temperature than the material forming the superconducting pixel array. The reason for this is that a rather high electrical current is required to reach the critical current needed to control the optical properties of the superconducting mirror. One can conceive, however, of a superconducting pixel array in which the leads are not superconductors, but are normal conductors. These must be designed to be thick enough so that they can carry their respective currents without overheating. Such leads are readily formable using thick-film silk-screen printing methods of the prior art.

Once the superconducting pixel array has been formed, using methods of the prior art, I have determined that said individual pixels can be switched in and out of the superconducting state by a combination of any of the three main modes of operation, current, magnetic field intensity, and temperature. For the most part, I prefer to use the electrical current method as the mode of control in which the switching occurs mostly by priming and switching currents. Nevertheless, it should be understood that any other configuration in which switching is accomplished by any of the combinations already presented, including electrical, magnetic and/or thermal means, are part of the instant invention.

A simple method of quenching any desired reflective superconducting pixel in an array can be accomplished by passing a current pulse on the horizontal lead, and then changing it over to the quenched state by an induced field from the current in the horizontal lead. In this case, the switching driver must be separated from the superconducting pixel array by a very thin insulating layer. Said layer must be thick enough to avoid tunneling between the superconducting pixel and its switching lead. The appropriate orientation of the horizontal lead to the vertical lead near a superconducting pixel array does not necessarily need to be perpendicular. The lead near the superconducting pixel array can be also parallel to the vertical lead before it continues to the next superconducting pixel in line.

Another method involves actually passing the two currents (priming and switching) through the selected superconducting pixels in the array, in which case co-directionality is once again not absolutely required, but the most efficient.

Referring again to FIG. 1, I have depicted the case where each lead is terminated with a switchable isolator (4), consisting of a resistor and a diode in parallel. Not shown in the drawing are similar isolations on the vertical, or priming leads. The diode (which can be a tunnel diode, or a Josephson junction diode) is switched when the appropriate driver is actuated, allowing the current to pass through a line of superconducting pixels in the array. At any given time, when a given superconducting pixel in the nth row and mth column of the array is to be switched on, the two respective leads are actuated and only the superconducting pixel, in which both the priming impulse and switching impulse are coincident, will switch to the normal state.

I have also discovered that such isolation is required only for the co-current approach (to avoid diversion of a current to an adjacent row or column). In the induced switching using thermal priming, for instance, both the priming and switching are electrically isolated. This avoids the need for separate coincident-isolation circuits. Of all the methods presented to affect switching, the thermal priming method is too slow in case where a high refresh rate is required for the display.

As an example of practice of my new and improved invention, consider a very large display with 1000 rows and 1000 columns, wherein the codirectional-current approach is used. Such a display is much more complex and has a higher pixel density than any now in use, or contemplated to be used.

In this case, the image refreshing, or raster image as it is known in the prior art, needs to be changed one hundred times every second (almost twice current practice in standard television). In the design of my new invention, a fixed 100 khz signal roving through the horizontal leads will cause each column of superconducting pixels in the array to become primed for switching. I have termed this signal (which is fixed and not coded) the priming scan. In the vertical switching leads, signals are sent on the vertical lines that coincide with pixels needing to be quenched so as to form the desired picture raster. Quenching occurs only when both the vertical and horizontal signals are time coincident in a given superconducting pixel array.

For the screen described (very high resolution and very high repeat rate by existing standards), I have determined that a monochrome screen will require a 100 KHz fixed signal, and a coded 100 MHz signal. For a color screen, a 300 MHz coded signal plus a full grey scale (16 levels) signal of about 2 Ghz signal is sufficient. These signals are quite within the capabilities of Josephson junction technology. With a driver as described herein, the priming scan time on each lead is 10 microseconds long, while the switching pulses are 10 nanoseconds long.

In order to lower the frequency requirements of my new high performance display so as to allow for increasing the "switched on" intervals, which in the above description are only 10 nanoseconds, a design in which the array is divided into 100 subarrays each containing 100×100 superconducting pixels can be used. In this design, the main array is capable of handling all the information to all the subarrays in parallel thus allowing an increase in the switched-on time. It should be clear to those skilled in the art that fixed images and slowly changing designs can be implemented in a similar manner, but at lower modulation rates.

Finally, the quenched state lifetime, or dwell time of the pixels, must also be considered. If the transition back to the superconducting state is too fast, the image perception may be affected. The following design elements of the instant invention were made so as to control the duration of the quenched state.

A small local temperature rise occurs after each quenching state. This is associated with the quenching mode and is due to the dissipation of the "trapped" current in the quenched superconductor. This temperature rise creates a decay time which is often sufficient to leave the nonsuperconducting state on for the desired period (about one microsecond). In some designs it may be desired to minimize the said temperature rise. Then, prolongation of the switched state can be achieved by optimizing the resistance and capacitance which are associated with each pixel so as to slow down the discharge of the trapped current, thereby delaying the decay to the superconducting state. With appropriate RC design in the system the decay time of each pixel to the nonsuperconducting state can be slowed down to the microsecond to millisecond range, which may be required in some applications.

Arrays of superconducting elements do not need to be flat, but can assume any shape on which the manufacturer can accurately deposit the different layers.

A large number of variations and geometries are feasible in the manufacture of superconducting pixel arrays. I shall now detail a specific type of one of the family of devices. This implementation of the instant invention involves switching with simultaneously applied current to each superconducting pixel of the array in a manner that is co-directional. This implementation requires relatively low switching currents but as a result the design is more complex than other less current efficient implementations.

Figure 2:
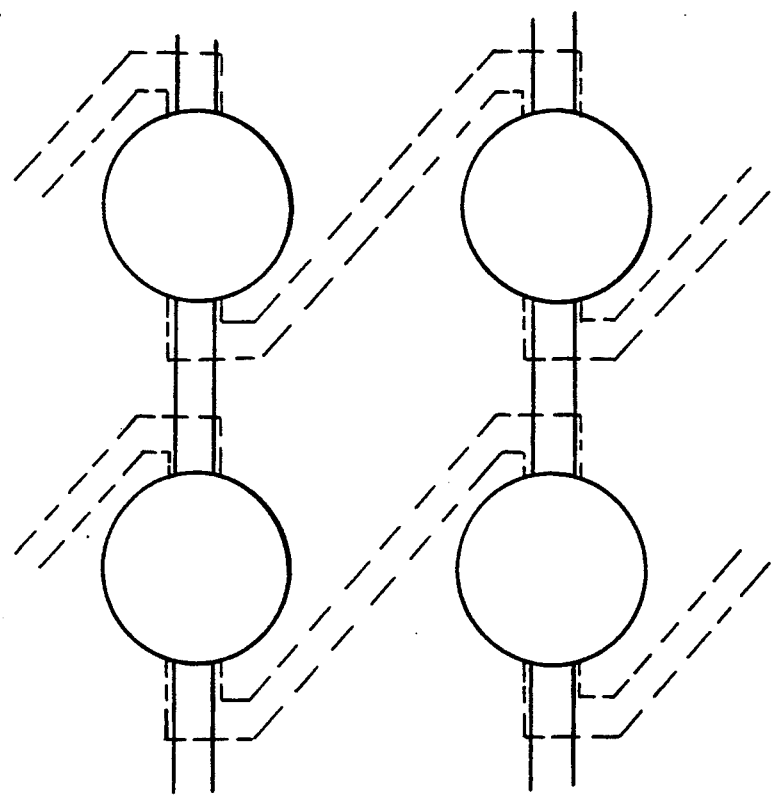
FIG. 2 is a diagram showing the geometry of the leads connected to the individual superconductor disks.

In FIG. 2, an array of four superconducting pixels, representative of two adjacent rows and columns, is shown. The circles in FIG. 2 are the superconducting media, consisting of flat disks with thickness as thin as possible but at least four times the penetration depth of the magnetic field. (To operate as a superconducting mirror capable of reflecting visible light, a room temperature superconducting material is required, once a large number of room temperature superconducting materials are found, the choice of this superconductor can be optimized relative to other properties).

The vertical solid lines in FIG. 2 depict priming leads connecting the superconducting pixels in columns. The diagonal broken lines depict the horizontal switching leads of the array, connecting the superconducting pixels in rows. It is best that both be made of a refractory superconducting material.

In the configuration depicted here, the switching leads and priming leads are designed to create co-directional currents within the superconducting pixel array.

As mentioned above, with allowance for higher currents, the more complex design incurred here can be alleviated with orthogonal currents, or with magnetic field induced switching from an electrically isolated switching current. For instance, in the current mode, all that is necessary is to connect one side of each pixel (FIG. 1) in a row to one lead (the row lead), and the opposing side of each pixel to its column lead, thus creating a network of pixels connected in parallel rather than in series, and having only two leads per superconducting pixel array (unlike the priming and switching device in which each superconducting pixel array has 4 terminations). Note that the row leads are each connected to a current source (if we want to quench only one pixel per row at any given time) or a voltage source with variable current capabilities (if we want to simultaneously quench a large number of pixels in a given row. In this arrangement, we actuate a given column and row, and only one current. The critical current passes through the superconducting pixel array, i.e.—from row n to column m. If we use a dynamic fixed voltage (variable current source) on the rows, a multiplicity of superconducting pixel arrays all in row n are quenched simultaneously, with the applied current splitting into different columns (which have been simultaneously de-isolated).

While I have also found that diamond like carbon and magnesium fluoride films are excellent insulating layers that are also transparent and therefore ideal for the instant invention, it should be emphasized that many other transparent insulators could be considered, providing that their interaction with the active element does not negatively impact the surface properties of the superconducting pixel array.

Applications of the principles and apparatus design of my new invention are numerous. Switchable superconducting pixel arrays can be used for positioning and moving diamagnetic colloids as well as ferrofluids. With superconductors possessing critical temperature around ambient, the application of superconducting pixel arrays can also be contemplated in the fields of chemical diagnosis, automated simultaneous immunoassays, biotechnological engineered pharmacological harvesting from natal solutions, localized drug delivery, printed circuit boards manufacture, vacuum seals and many other technologies.

With a number of important variations, the principles of switchable superconducting pixel arrays are applicable to flat screen display technology. A significant potential advantage of the instant invention is that one can in principle produce much larger displays than those of the prior art.

For special display purposes, the screen can even be made in a curved shape, including a full sphere, providing just enough inlet for information cables at the sphere poles. Other applications include small flat screens for home appliances and scientific instruments, wall pictures like the omnipresent flat screen TV, and others.

Figure 3A:
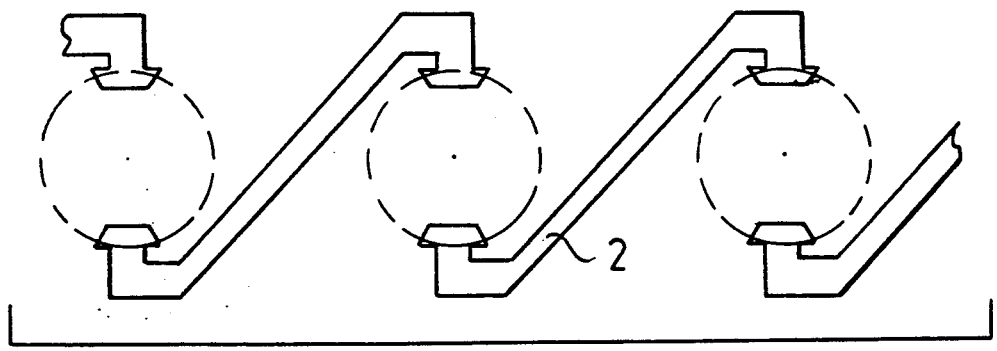
FIGS. 3A, 3B and 3C are diagrams illustrating steps in the method of making the array.
Figure 3B:
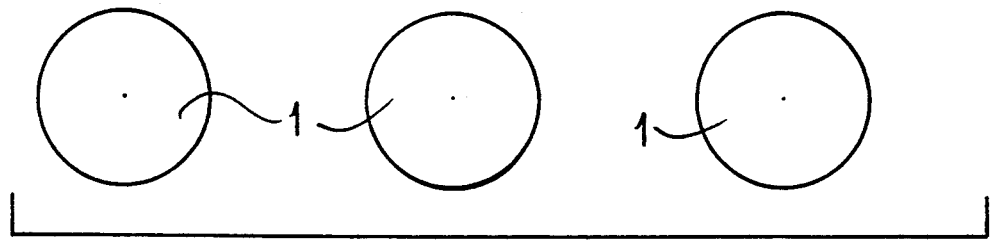
Figure 3C:
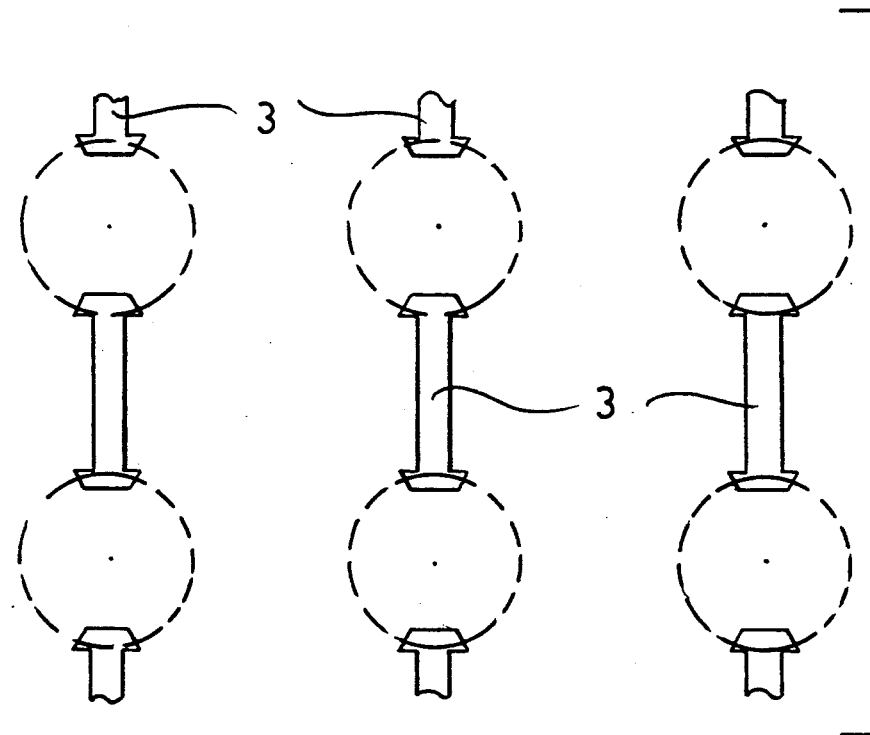
Figure 4A:
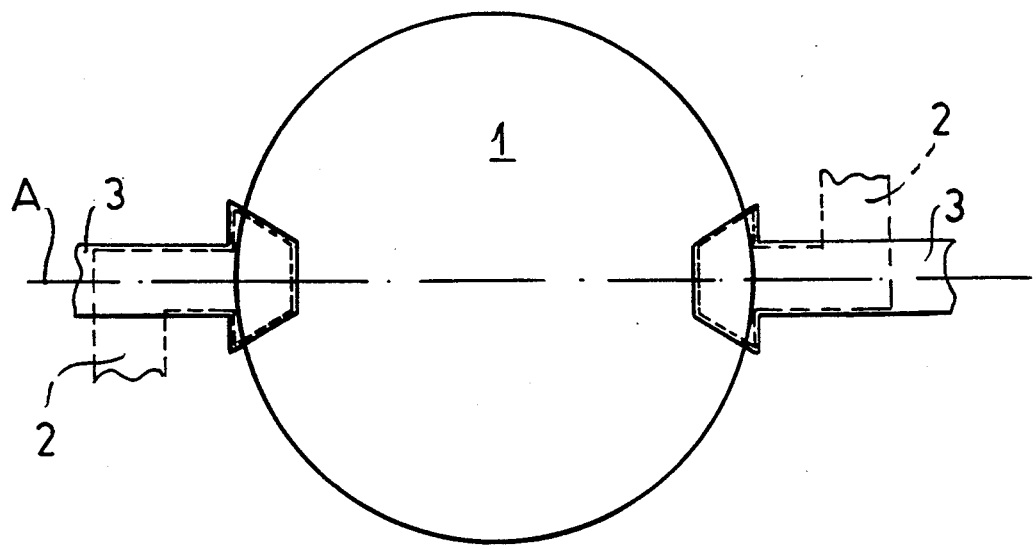
FIG. 4A is a plan view facilitating an understanding of this method.
Figure 4B:
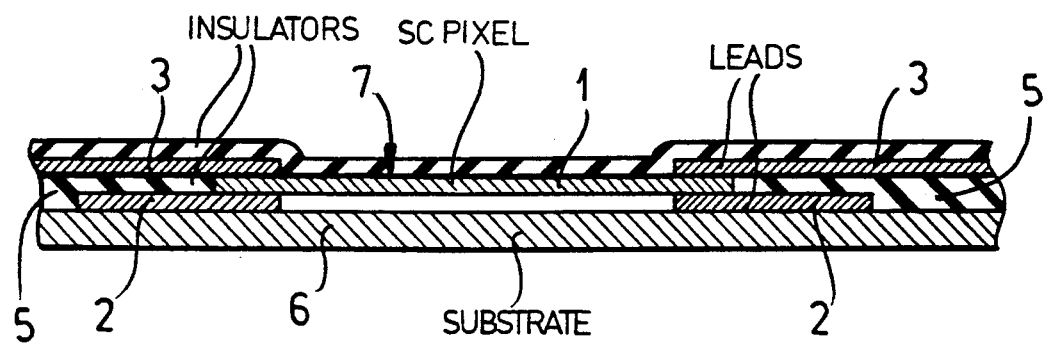
FIG. 4B is a cross sectional view taken along the line A of FIG. 4A.

In FIGS. 3A-3C and FIGS. 4A and 4B, I have depicted the technique by which the array described in FIG. 2 is manufactured. FIG. 3A shows the layout of the horizontal switching leads. An insulating layer (the bottom half of the layers of FIG. 4B is first deposited on the substrate 6 which is made of polished quartz. The insulating layer is made of diamond like carbon about 5000 angstrom thick, using methods described in a copending application entitled "Superconducting mirrors". Next, a screen having the desired form of the leads is put into place and the diamond like carbon insulator is plasma etched back in the open location to the substrate. Aluminum leads 2 are then deposited in the channel formed by plasma deposition from an aluminum target. When the screen is removed, a surface consisting of areas with insulation plus the leads results. At this stage, a plasma etching process is useful to bring the whole surface to a flat finish. Now, one is ready to deposit the active superconducting pixels 1 of the array.

The next step is the deposition of the contacts 3, followed by deposition of the insulating layer 7. The superconducting pixels 1 are active 1,2,3 layers deposited as very thin disk forms about 4000 to 5000 angstrom thick, with a diameter of about 50 microns as shown in FIG. 3B. This is achieved through a mask, and followed by the deposition through an inverse mask (created through the circular mask after the deposition of the disks) of the additional insulator (separating the bottom switching leads from the top priming leads). Then the vertical priming leads 3, depicted in FIG. 3 are deposited, and the device is completed by depositing the sealing insulating layer 7 on the whole surface.

FIG. 4A is a top view of a completed single pixel wherein 1 again is the active superconductive element, the horizontal switching leads are shown at 2 and the vertical priming leads are seen at 3. In FIG. 4B, which is a vertical cross section through the leads, the substrate (6), the inter-lead insulating layer (5), which was formed in two steps and the sealing insulation (7) are depicted as well.

Figure 5:
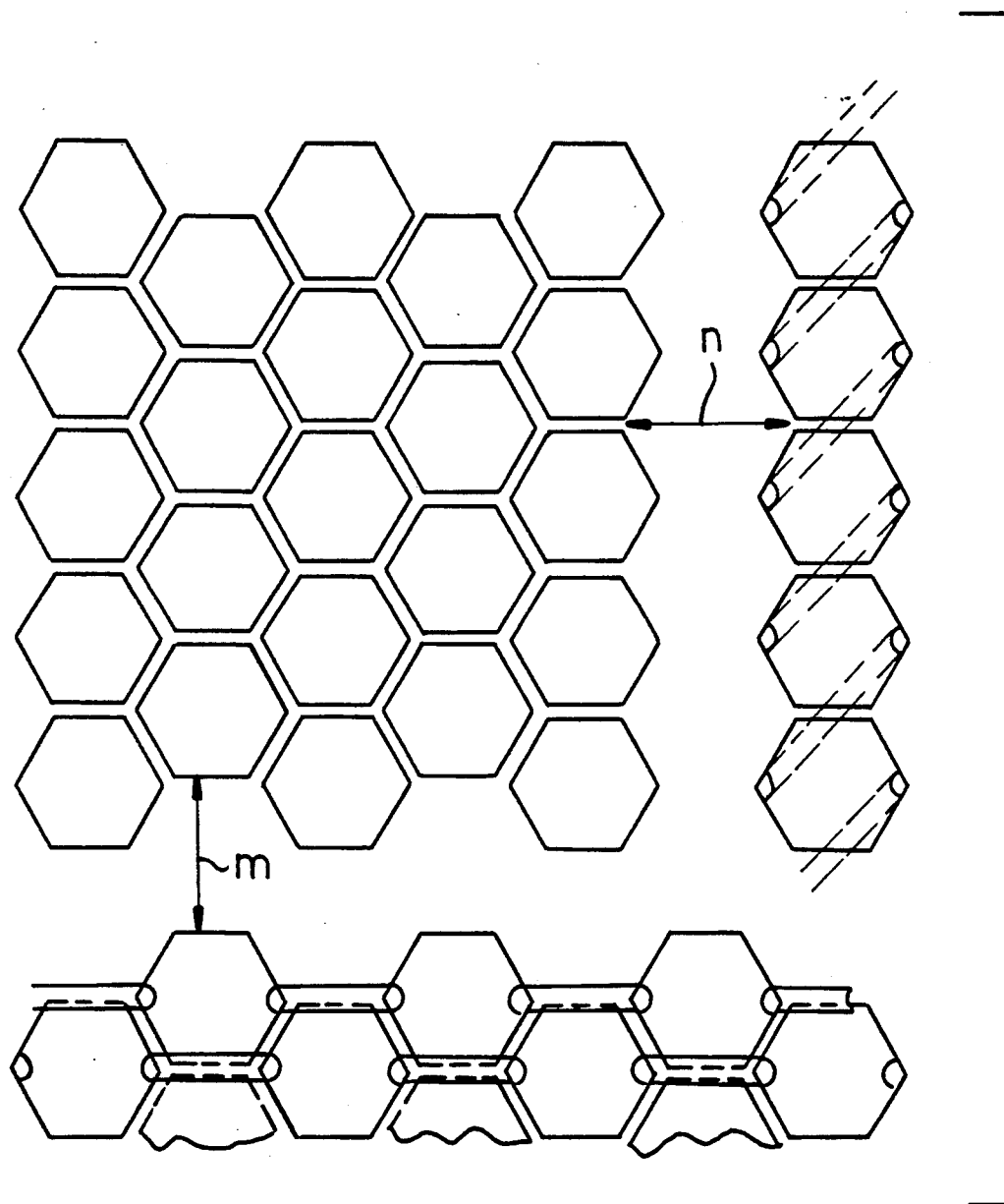
FIG. 5 is a diagram illustrating the close packed arrangement of pixels of another array according to the invention.
Figure 6:
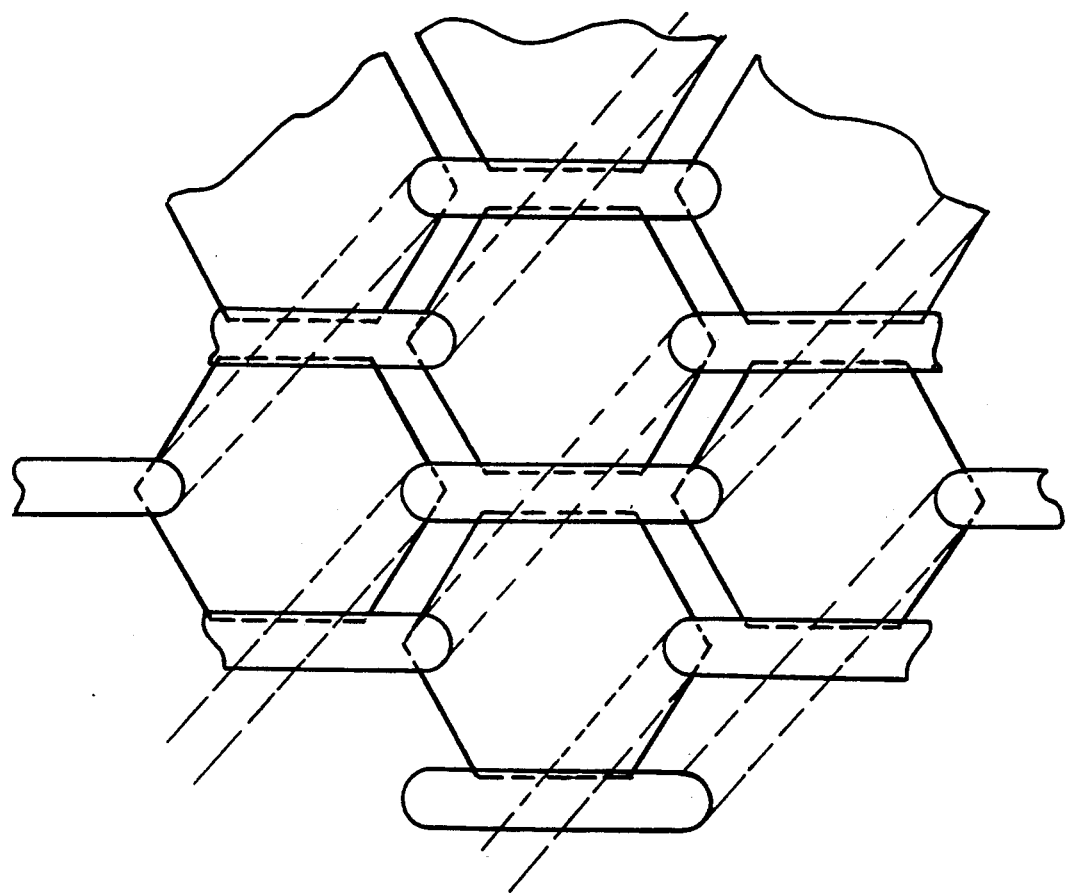
FIG. 6 is a detail view diagrammatically illustrating the connection of the leads for this array.
Figure 7:
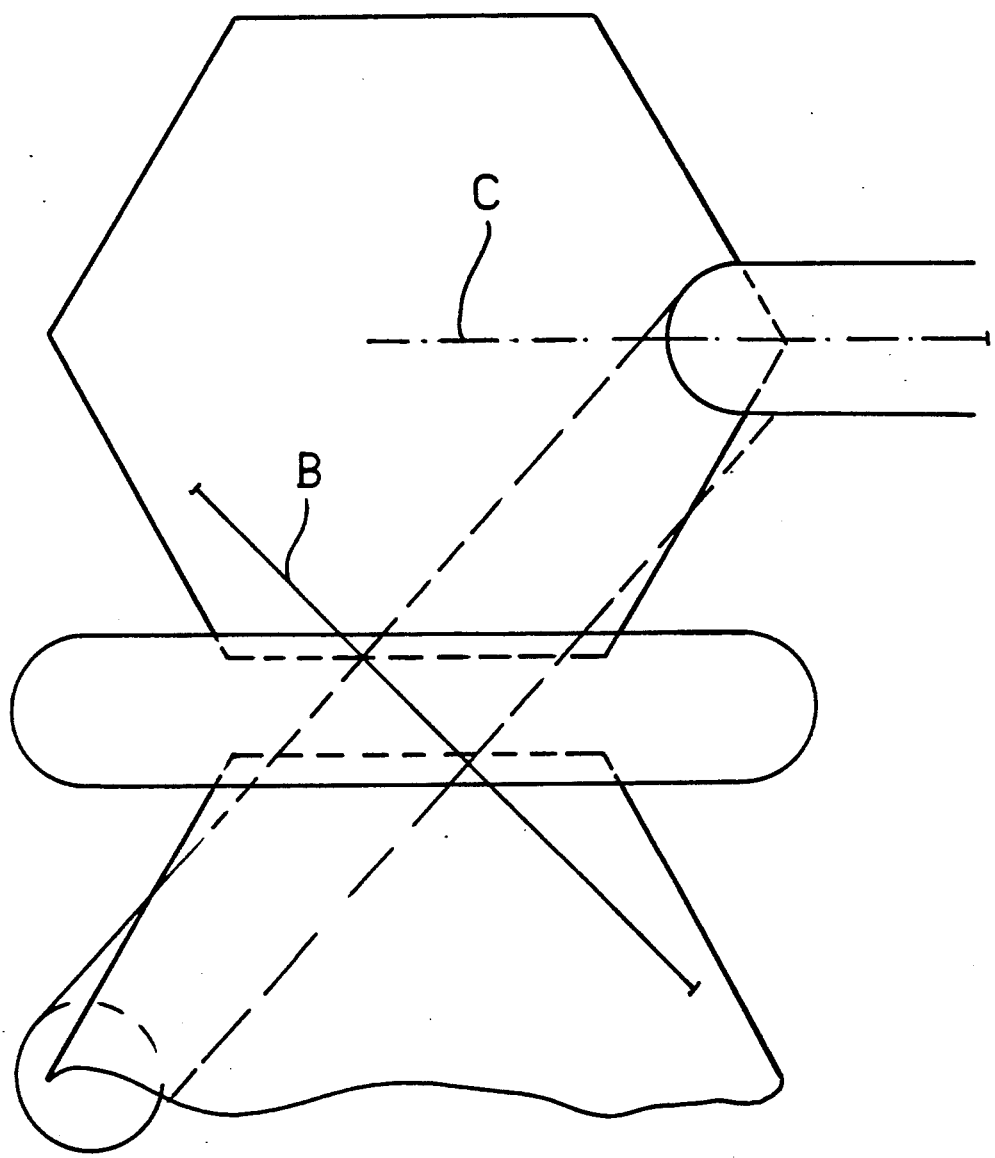
FIG. 7 is a detail view of a single pixel of this array.

When a high density of superconducting pixels are required, for instance, for the management of magnetic fluids, one can use closely packed pixels as shown in FIG. 5. as a tessallation of closely packed hexagonal superconducting pixels. The tessellation consists of n columns and m rows. The vertical switching leads are shown on the left side and the horizontal priming leads are shown at the bottom of the figure. FIG. 6 shows further details of deposition planes needed for the four superconducting pixels illustrated. Note that there are projections of the leads on the active element in areas that are not involved with the contacts. This more complex design is needed in order to achieve a high density of superconducting pixel arrays, switchable by the more complex (but more current efficient) co-directional current switching-method. As seen in FIG. 6, the vertical leads which interconnect all the superconducting pixel arrays in a column are diagonal, from the left side of the lower superconducting pixel array to the right side of the next superconducting pixel array. These horizontal priming leads simply connect the adjacent corners of two superconducting pixel arrays. In FIG. 7 are shown details of a single pixel of this array and its vertical and horizontal leads.

Figure 8:
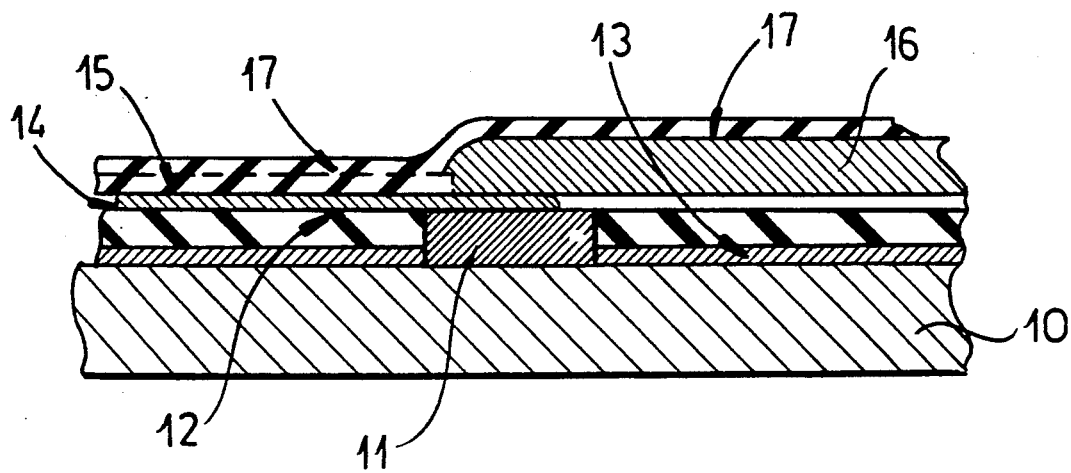
FIG. 8 is a cross sectional view taken along the line B of FIG. 7.
Figure 9:
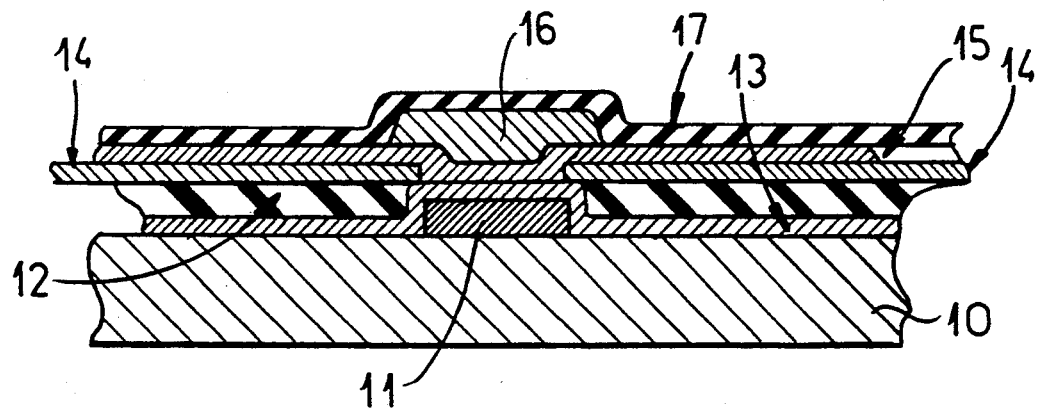
FIG. 9 is a cross sectional view taken along the line C of FIG. 7.

The manufacture of this superconducting pixel array is achieved as follows. (See FIGS. 8 and 9). First we deposit on the substrate (10) the vertical priming leads (11). The second layer (12) is an insulating layer. The formation of the circular segment contact pads, can be achieved in two ways. The original contacts can be made thicker than necessary. Then the pad alone is covered with an etch-resist film, and the rest of the leads are etched back to allow for the thickness of the insulating layer, using methods known to the prior art. Then the insulating layer 12 and 13 are deposited. When the etch-resist is dissolved, it uncovers the fresh pad so that it is in direct contact with the next layer. This two step process is required only when polishing of the surface prior to deposition of the active layer is desired. Note that in FIG. 8, the vertical lead is also its contact with the active layer, and is thicker than in FIG. 9 where the cross section is not through a contact pad.

The next step is the deposition of the active layers 14 in very thin hexagonal forms (14), using methods as described above.

Once this is accomplished, another insulating layer 15 is deposited, so that all the surface is covered except the horizontal leads which contact areas on the active superconductor. The final step is deposition of the horizontal priming leads (16) followed by a sealing insulation (17).

Figure 10A:
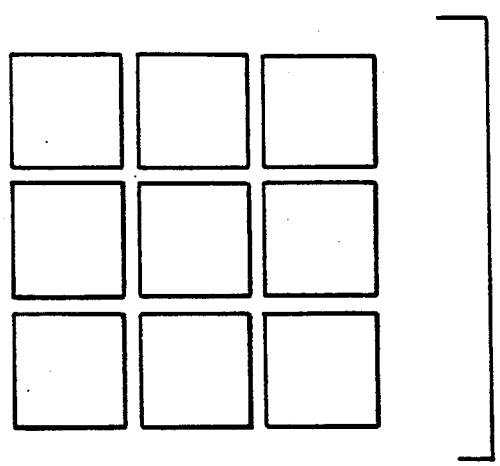
FIGS. 10A, 10B and 10C are plan views showing other layouts of pixels in an array according to the invention.
Figure 10B:
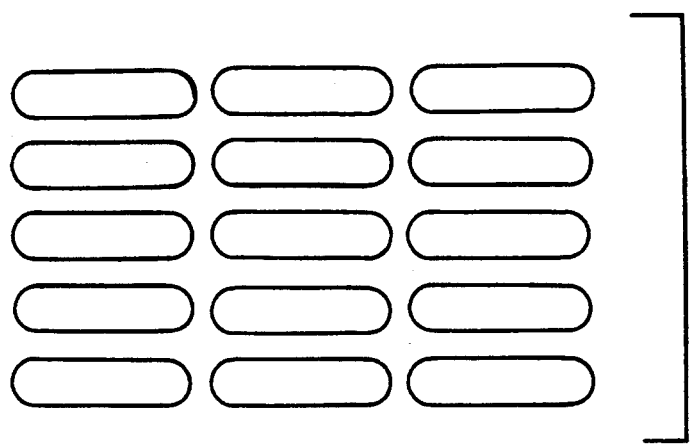
Figure 10C:
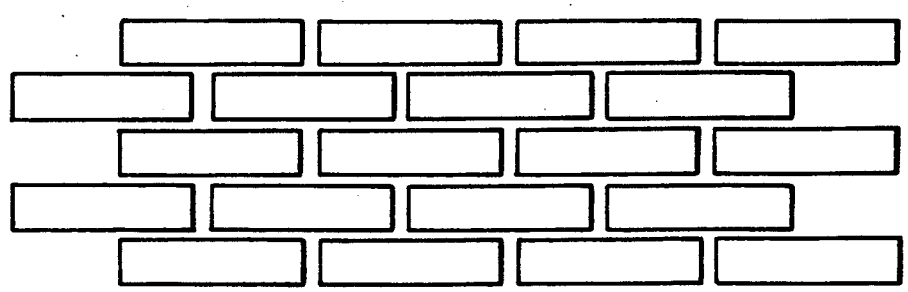

FIGS. 10A and 10C show three additional tessellations, to demonstrate that an array can be designed with a variety of superconducting pixel array geometries. Any geometrical surface can be used for a superconducting pixel array as long as it is topologically singly connected. In the earlier embodiments two codirectional-currents were used to cause the transition from the superconducting phase to the normal phase. It should be understood that this invention can be implemented with any priming and switching means that can force the reversible transition from the superconductive to the normal states in each superconducting pixel array.

SPECIFIC EXAMPLE

In the art of thermal imaging it is desired to reconstruct as sequential signals the existence or lack thereof of far infrared radiation (wavelength longer than 20 microns). It is extremely difficult to create a high resolution focal plane array of sensors in traditional mercury cadmium telluride sensors, mostly because the properties of the material cannot be kept the same over large surfaces, an absolute prerequisite.

I have solved this problem by using an array of switchable mirrors having a resolution of 1 dot per millimeter (namely in a 2 cm×2 cm array I have 400 micro-mirrors), each pixel having a diameter of 0.5 mm and spaced 1 mm apart, manufactured essentially in the same manner as described in example 1, except that both the priming and the switching currents are above the critical current of the pixel. As a result the array when powered does not reflect and only when the current in both a row and a column are switched off does one pixel at any time, the one in that row and that column, return to the superconducting and thus reflecting state.

In order to obtain a diffuse reflection or Lambertian sources, after the deposition of about 1000 angstrom of the final diamond like carbon at an acetylene pressure of 1 millitorr, which yields a very smooth surface, the acetylene pressure is raised to 0.1 torr, resulting in rapid build up of diamond like carbon but also a somewhat rough surface.

The mode of operation is as follows. The array is kept at liquid nitrogen temperature and is positioned at the focal point of an infrared optical system. An infrared sensor (Cd- Hg-Te) about 3 mm×3 mm is positioned about 8 mm above the side center of the array, outside the optical path of the infrared optic at an angle of 45° to the array plane. This sensor as well is liquid nitrogen cooled. (In principle other infrared sensors, for instance superconductor based sensors could be used as well). The output of the infrared sensor is phased locked to the scanning of the currents on the array, so that each reflection sensed from the array can be identified with one and only one pixel array. While the system can easily operate at more than 100 khz, it is rarely necessary to refresh the image more often than 10 times per second and thus a 4000 Hertz scanning rate, is quite sufficient.

In order to calibrate the system for spatial differences of the pixels relative to the sensor as well as intrinsic optical differences that still exist in this yet imperfect implementation, a single correcting 400 point convolution function is generated by illuminating the array with a fixed homogeneous source. This function is memorized and intensities observed by the sensor are corrected for the existing pixel intrinsic differences as well as geometrical asymmetry.

It should also be understood that this invention can be implemented by any single switching modes rather than pairs of switching modes, involving current, magnetic field and thermal switching.

It is understood that the above described embodiments of the invention are illustrative only and modifications and alterations thereof may occur to those skilled in the art. Accordingly, it is desired that this invention not be limited to the embodiments disclosed herein but is to be limited only as defined by the appended claims.

I claim:

1. A multielement control or display device, comprising:

an array of discrete flat, intrinsically continuous superconductive elements in mutually parallel rows and, orthogonal to aid rows, in mutually parallel columns and constituting individual pixels of said array, each of said superconductive elements being composed of a material having a critical temperature below which the superconductive element is in a superconductive state and above which the superconductive element is in a nonsuperconductive state and a critical current density below which said superconductive element is in said superconductive state and above which the superconductive element is in said nonsuperconductive state, said superconductive elements also switching between said states upon application of a critical magnetic field, whereby applied current traversing said elements, applied temperatures of said elements and applied magnetic fields affecting said elements form state-changing parameters of said elements; and means for selectively applying at least one of said parameters to at least selected ones of said elements to quench said selected ones of said elements to provide selected directly optically discernible patterns of said pixels of said array.

2. The multielement control or display device defined in claim 1 wherein said means for selectively applying at least one of said parameters to at least selected ones of said elements comprises:

means for applying at least one of said parameters to a plurality of said elements of at least one of said rows at a magnitude insufficient to switch the elements of said row from one of said states to the other of said states, thereby priming said plurality of elements; and means for applying to at least some of said columns a magnitude of at least one of said parameters sufficient to switch the primed elements from said one of said states to the other of said states but insufficient to switch unprimed elements from said one of said states to the other of said states.

3. The multielement control or display device defined in claim 2 wherein said elements are of the same geometrical outline.

4. The multielement control or display device defined in claim 3 wherein said elements are of a round shape.

5. The multielement control or display device defined in claim 3 wherein said elements are of a polygonal shape.

6. The multielement control or display device defined in claim 3 wherein said elements are primed by applying a current to said plurality of said elements of at least one of said rows as said one of said parameters at a magnitude insufficient to switch the elements of said row from one of said states to the other of said states, thereby priming said plurality of elements.

7. The multielement control or display device defined in claim 3 wherein said elements are primed by applying energy to raise the temperature of said plurality of said elements of at least one of said rows as one of said parameters at a magnitude insufficient to switch the elements of said row from one of said states to the other of said states, thereby priming said plurality of elements.

8. The multielement control or display device defined in claim 3 wherein said elements are primed by applying a magnetic field to said plurality of said elements of at least one of said rows as said one of said parameters at a magnitude insufficient to switch the elements of said row from one of said states to the other of said states, thereby priming said plurality of elements.

9. The multielement control or display device defined in claim 3 wherein said elements are switched by applying a current as said parameter of a magnitude sufficient to switch the primed elements from said one of said states to the other of said states but insufficient to switch unprimed elements from said one of said states to the other of said states.

10. The multielement control or display device defined in claim 3 wherein said elements are switched by applying a magnetic field as said parameter of a magnitude sufficient to switch the primed elements from said one of said states to the other of said states but insufficient to switch unprimed elements from said one of said states to the other of said states.

11. The multielement control or display device defined in claim 3 wherein said elements are switched by applying a temperature raising energy as said parameter of a magnitude sufficient to switch the primed elements from said one of said states to the other of said states but insufficient to switch unprimed elements from said one of said states to the other of said states.

12. The multielement control or display device defined in claim 2 wherein said means for selectively applying at least one of said parameters to at least selected ones of said elements comprises:
means for applying at least two of said parameters to a plurality of said elements of at least one of said rows at magnitudes insufficient to switch the elements of said row from one of said states to the other of said states, thereby priming said plurality of elements; and
means for applying to at least some of said columns a magnitude of at least one of said parameters sufficient to switch the primed elements from said one of said states to the other of said states but insufficient to switch unprimed elements from said one of said states to the other of said states.

13. The multielement control or display device defined in claim 2 wherein said means for selectively applying at least one of said parameters to at least selected ones of said elements comprises:
means for applying at least one of said parameters to a plurality of said elements of at least one of said rows at a magnitude insufficient to switch the elements of said row from one of said states to the other of said states, thereby priming said plurality of elements; and
means for applying to at least some of said columns magnitudes of at least two of said parameters sufficient to switch the primed elements from said one of said states to the other of said states but insufficient to switch unprimed elements from said one of said states to the other of said states, said magnitudes of each of said at least two parameters being insufficient individually to switch the primed elements from said one of said states to the other of said states.

14. The multielement control or display device defined in claim 2 wherein said at least one of said parameters applied to a plurality of said elements of at least one to said rows at a magnitude insufficient to switch the elements of said row from one of said states to the other of said states, thereby priming said plurality of elements, and said at least one of said parameters sufficient to switch the primed elements from said one of said states to the other of said states are applied simultaneously to said array.

15. The multielement control or display device defined in claim 2 wherein said at least one of said parameters applied to a plurality of said elements of at least one of said rows at a magnitude insufficient to switch the elements of said row from one of said states to the other of said states, thereby priming said plurality of elements, and said at least one of said parameters sufficient to switch the primed elements from said one of said states to the other of said states are applied successively to said array in any order.

16. The multielement control or display device defined in claim 2, further comprising coincidentally switchable isolation circuits isolating the rows of elements from one another.

17. The multielement control or display device defined in claim 16, further comprising coincidentally switchable isolation circuits isolating the columns of elements from one another.

18. The multielement control or display device defined in claim 2 wherein all of the elements of each of said rows are connected electrically in series and all of the elements of each column are electrically isolated from the other elements to the respective column.

19. The multielement control or display device defined in claim 2 wherein said elements are mirrors which are transformed from a reflective mode corresponding to the respective superconductive state to a nonreflective mode corresponding to said nonsuperconductive state.

20. The multielement control or display device defined in claim 2 wherein said elements are positioned to modulate magnetic fields.

21. The multielement control or display device defined in claim 2 wherein said elements are positioned to control a diamagnetic colloid.

22. The multielement control or display device defined in claim 2 wherein said array forms a display.

* * * * *